(12) United States Patent
Sakai

(10) Patent No.: US 12,278,553 B2
(45) Date of Patent: Apr. 15, 2025

(54) GATE DRIVING CIRCUIT FOR POWER SEMICONDUCTOR ELEMENT

(71) Applicant: Mitsubishi Electric Corporation, Tokyo (JP)

(72) Inventor: Takuya Sakai, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 244 days.

(21) Appl. No.: 17/927,893

(22) PCT Filed: Jul. 16, 2020

(86) PCT No.: PCT/JP2020/027606
§ 371 (c)(1),
(2) Date: Nov. 28, 2022

(87) PCT Pub. No.: WO2022/013998
PCT Pub. Date: Jan. 20, 2022

(65) Prior Publication Data
US 2023/0208274 A1    Jun. 29, 2023

(51) Int. Cl.
*H02M 1/08* (2006.01)
*H02M 1/00* (2006.01)

(52) U.S. Cl.
CPC ........... *H02M 1/08* (2013.01); *H02M 1/0009* (2021.05)

(58) Field of Classification Search
CPC ............ H02M 1/0009; H02M 1/0025; H02M 1/0029; H02M 1/0038; H02M 1/0054;
(Continued)

(56) References Cited

U.S. PATENT DOCUMENTS

| 10,715,057 B2 | 7/2020 | Gu et al. | |
| 2004/0076021 A1* | 4/2004 | Miyamoto | H02M 3/3385 363/21.01 |

(Continued)

FOREIGN PATENT DOCUMENTS

| JP | 2002119044 A | 4/2002 |
| JP | 2008182835 A | 8/2008 |

(Continued)

OTHER PUBLICATIONS

Extended European Search Report issued Sep. 28, 2023 in corresponding European Patent Application No. 20945160.8, 11 pages.
(Continued)

*Primary Examiner* — Thienvu V Tran
*Assistant Examiner* — Carlos O Rivera-Perez
(74) *Attorney, Agent, or Firm* — XSENSUS LLP

(57) ABSTRACT

Provided is a power semiconductor element gate driving circuit that performs ON/OFF control on main current of a power semiconductor element having a gate electrode by charging the gate electrode of the power semiconductor element with electric charges and discharging the electric charges on the basis of an inputted gate signal. When the gate signal is switched to an OFF signal, control is performed such that gate current for discharging the electric charges from the gate electrode increases in association with increase in a temperature of the power semiconductor element and decreases in association with increase in the main current.

15 Claims, 6 Drawing Sheets

(58) Field of Classification Search
CPC .......... H02M 1/08; H02M 1/088; H02M 1/32;
H02M 1/325; H02M 1/327; H02M 1/38;
H02M 1/385; H02M 7/162; H02M 7/219;
H02M 7/521; H02M 7/5387; H03K
2017/066; H03K 2017/0806; H03K
17/08; H03K 17/082; H03K 17/0822;
H03K 17/0826; H03K 17/0828; H03K
17/14; H03K 17/145; H03K 17/16; H03K
17/168; Y02B 70/10; H02H 9/00; H02H
9/001; H02H 9/002; H02H 9/005; H02H
9/02; H02H 9/025; H02H 9/026
USPC ........ 323/265, 266, 271–278, 280, 282–285,
323/289, 351, 908; 363/16, 17, 50–58,
363/78, 79, 89, 95, 97, 98, 123, 131, 132;
361/16, 17, 50–58, 78, 79, 89, 95, 97, 98,
361/123, 131, 132; 327/108, 109, 306,
327/309, 310, 365, 378
See application file for complete search history.

(56) References Cited

U.S. PATENT DOCUMENTS

| | | |
|---|---|---|
| 2011/0012542 A1 | 1/2011 | Inamura et al. |
| 2013/0285732 A1 | 10/2013 | Mori |
| 2015/0318850 A1 | 11/2015 | Hiyama |
| 2015/0358013 A1 | 12/2015 | Sakai et al. |
| 2016/0099665 A1 | 4/2016 | Chen et al. |
| 2018/0281600 A1* | 10/2018 | Zhou .......................... B60L 3/04 |

FOREIGN PATENT DOCUMENTS

| | | |
|---|---|---|
| JP | 2013-219633 A | 10/2013 |
| KR | 10-2017-0018466 A | 2/2017 |
| WO | 2014123046 A1 | 8/2014 |

OTHER PUBLICATIONS

Office Action issued Apr. 25, 2024 in Korean Patent Application No. 10-2023-7000386, 9 pages.

Partial Supplementary European Search Report issued Jul. 13, 2023 in corresponding European Patent Application No. 20945160.8, 12 pages.

International Search Report and Written Opinion mailed on Oct. 20, 2020, received for PCT Application PCT/JP2020/027606, filed on Jul. 16, 2020, 8 pages including English Translation.

* cited by examiner

GATE DRIVING CIRCUIT FOR POWER SEMICONDUCTOR ELEMENT

CROSS-REFERENCE TO RELATED APPLICATION

The present application is based on PCT filing PCT/JP2020/027606, filed Jul. 16, 2020, the entire contents of which are incorporated herein by reference.

TECHNICAL FIELD

The present disclosure relates to a power semiconductor element gate driving circuit.

BACKGROUND ART

In general, a power conversion device performs power conversion between DC and AC through ON/OFF switching of main current of a power semiconductor element such as an IGBT or an MOSFET by charging a gate electrode of the power semiconductor element with electric charges and discharging the electric charges. In general, characteristics of the semiconductor element change according to the temperature thereof. Considering this, various countermeasures have been proposed. The countermeasures are intended to compensate for temperature characteristics of a power semiconductor element in a gate driving circuit in which a gate electrode of the power semiconductor element is charged with electric charges and the electric charges are discharged, i.e., gate current is controlled. For example, Patent Document 1 proposes a technology of detecting a temperature of a power semiconductor element and switching a gate resistance in an OFF state, in order to adjust gate current of the power semiconductor element according to change in a temperature condition or the like. In the case of this configuration, a control circuit for switching the gate resistance in stages is complicated.

In addition, a gate driving circuit in which both reduction in switching loss and reduction in switching noise can be automatically achieved even upon change in temperature, has been disclosed (Patent Document 2). In Patent Document 2, noise at the time of switching is reduced by adjusting gate current flowing while a power semiconductor element is ON. In the case of configuring a switching power supply such as an inverter, two power semiconductor elements are sometimes connected in series. In the configuration disclosed in Patent Document 2, both reduction in switching loss and reduction in switching noise can be achieved. However, in consideration of a time at which a switching time becomes longest in an operation-possible temperature region for the power semiconductor elements, a dead time needs to be provided such that the two power semiconductor elements connected in series are not simultaneously turned on. The dead time is a time of limiting a conduction period for each of the elements and inflicts influences such as: occurrence of distortion of a waveform outputted from the switching power supply; and occurrence of voltage fluctuation. These influences cause a greater error in the case of a power supply with a high switching frequency and a short switching cycle, such as a power supply in which a wide-bandgap semiconductor element is used as a power semiconductor element.

Further, Patent Document 3 describes a configuration in which a current threshold value at which a gate resistance is switched is changed according to a temperature. In Patent Document 3, control of a power semiconductor element in an ON state is mainly contemplated, and a technology of discontinuously adjusting a switching speed through complicated control as in switching of the gate resistance has been disclosed. Moreover, in Patent Document 3, when current is small, a switching time in an OFF state is particularly elongated, and a dead time is limited by the switching time in an OFF state. Thus, a long dead time is necessary.

CITATION LIST

Patent Document

Patent Document 1: Japanese Laid-Open Patent Publication No. 2002-119044
Patent Document 2: WO2014/123046
Patent Document 3: Japanese Laid-Open Patent Publication No. 2008-182835

SUMMARY OF THE INVENTION

Problems to be Solved by the Invention

As described above, conventionally, control with a focus placed on switching loss or a switching time in an ON state has been mainly contemplated, and contemplation on shortening a dead time in consideration of a switching time in an OFF state as well has not been conducted. In a constant-voltage drive circuit, for a power semiconductor element, that performs switching by charging a gate electrode with electric charges and discharging the electric charges, increase in the temperature of the element leads to reduction in a mirror potential so that a delay period taken to arrival at a switching time is elongated particularly at the time of switching in an OFF state. Further, increase in the temperature of the element leads to reduction in mirror current during constant-voltage drive. Thus, dVce/dt at the time of switching is reduced, and a period from input of an OFF signal for switching to end of the switching is elongated. Therefore, a long dead time needs to be set. This dead time causes an error in a power supply output and causes trouble during switching at a high frequency.

The present disclosure has been made to solve the above problems, and an object of the present disclosure is to, with a focus placed on a switching time in an OFF state, provide a power semiconductor element gate driving circuit in which: the switching time in an OFF state changes only a little even upon change in the temperature of a power semiconductor element and change in a current value; and a dead time can be shortened.

Solution to the Problems

A power semiconductor element gate driving circuit according to the present disclosure is a power semiconductor element gate driving circuit that performs ON/OFF control on main current of a power semiconductor element having a gate electrode by charging the gate electrode of the power semiconductor element with electric charges and discharging the electric charges on the basis of an inputted gate signal. When the gate signal is switched to an OFF signal, control is performed such that gate current for discharging the electric charges from the gate electrode increases in association with increase in a temperature of the power semiconductor element and decreases in association with increase in the main current.

Effect of the Invention

The power semiconductor element gate driving circuit according to the present disclosure has an advantageous effect of: being able to make setting such that a switching time in an OFF state changes only a little even upon change in temperature and change in current; and being able to shorten a necessary dead time.

DESCRIPTION OF EMBODIMENTS

Embodiment 1

Figure 1:
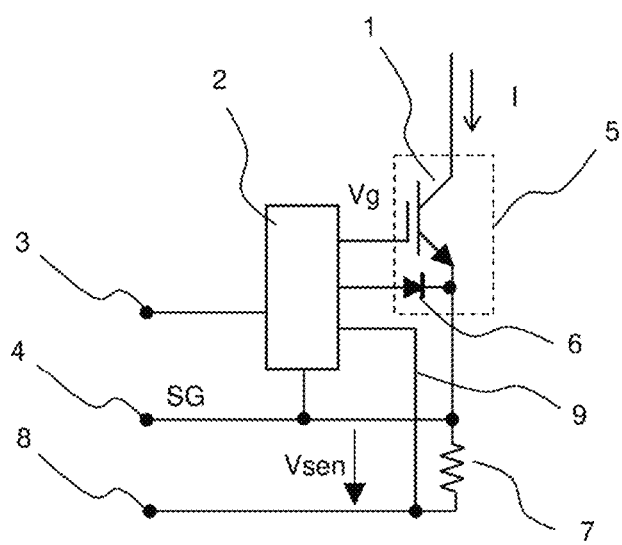
FIG. 1 is a circuit diagram showing a schematic configuration of a power semiconductor element gate driving circuit according to embodiment 1.

FIG. 1 is a circuit diagram showing a schematic configuration of a power semiconductor element gate driving circuit according to embodiment 1. A shunt resistor 7 is connected to an emitter terminal of a power semiconductor element 1 (also referred to as switch element 1). The potential of the emitter of the switch element 1, i.e., the potential of a reference potential terminal 4, is set as a reference potential (SG) of a drive control circuit 2. A diode 6 as a temperature sensor (also referred to as temperature sensor diode 6) for detecting a temperature of the switch element 1 is mounted on a chip 5 which is the same as that for the switch element 1. An output wire to which a load such as a power supply for supplying power, a capacitor, or a motor is connected, is connected to a terminal 8 on an opposite side, of the shunt resistor 7, to the emitter terminal. Collector current I flowing through the switch element 1 is converted into a voltage by the shunt resistor 7, and a voltage across the shunt resistor 7 (a voltage relative to a reference potential SG; hereinafter, Vsen) is inputted to the drive control circuit 2. It is noted that, although an IGBT is assumed as the switch element 1 in the present embodiment, the switch element 1 is not limited to an IGBT and may be a switch element having a gate electrode, such as a power transistor or an MOSFET.

As described above, to the drive control circuit 2, a voltage value relative to the reference potential SG is inputted as a temperature detection value of the switch element 1, and a voltage value relative to the reference potential SG is inputted as a current detection value of main current of the switch element 1. The temperature detection value is inputted as a positive voltage value relative to the reference potential, and the current detection value is inputted as a negative voltage value relative to the reference potential. The temperature detection value is, as described later, a positive voltage value that decreases in association with increase in the temperature, and the current detection value is a negative voltage value, an absolute value of which increases in association with increase in the current.

Figure 2:
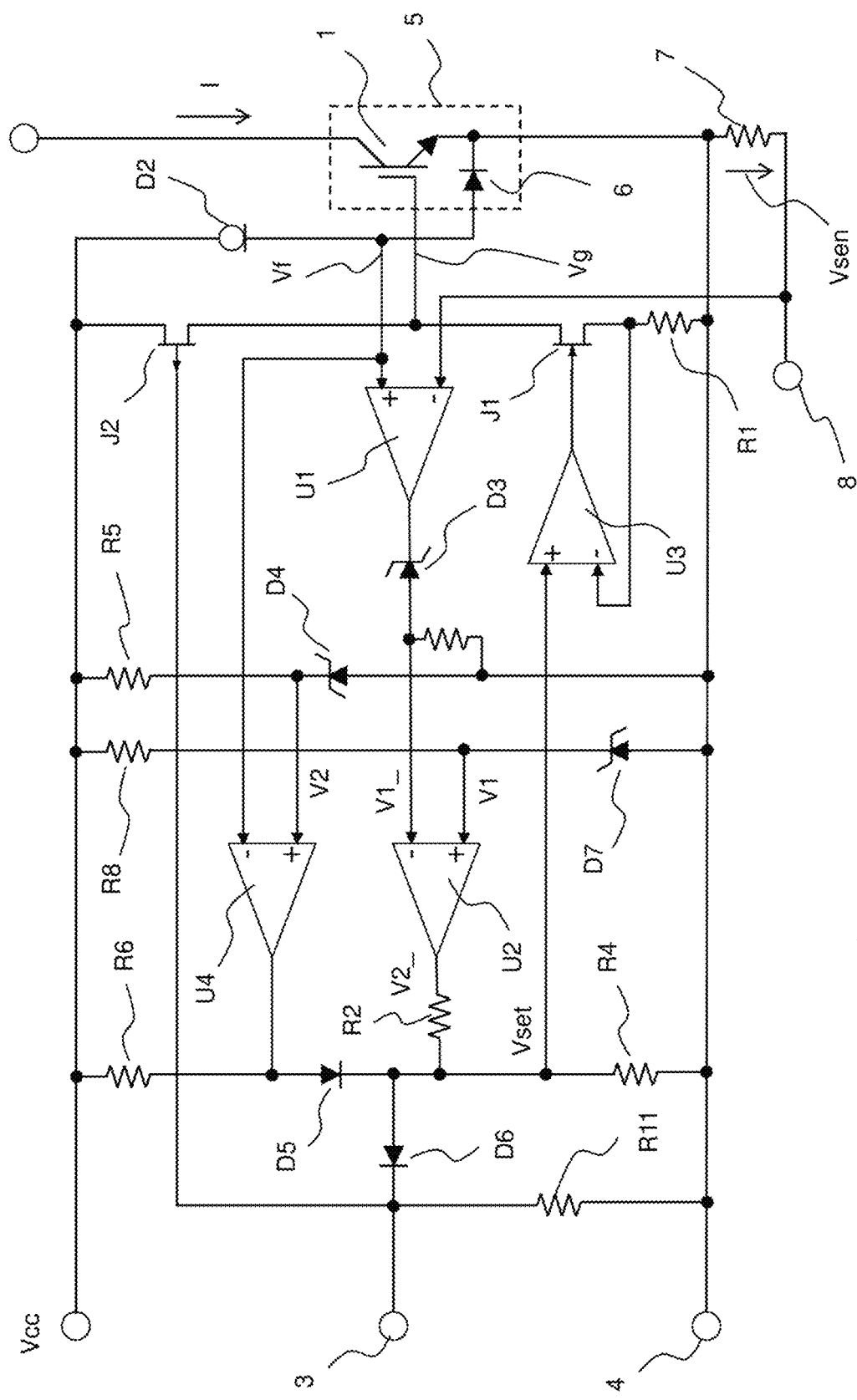
FIG. 2 is a circuit diagram showing a detailed configuration of the power semiconductor element gate driving circuit according to embodiment 1.

FIG. 2 is a circuit diagram showing a detailed configuration of the power semiconductor element gate driving circuit according to embodiment 1. This circuit is merely an example, and only parts related to the present disclosure are shown in FIG. 2. In the circuit in FIG. 2, a third differential amplifier U3 controls gate current such that the gate electrode of the switch element 1 is charged with electric charges and the electric charges are discharged, whereby ON/OFF control is performed on the collector current I which is main current flowing through the switch element 1. A first differential amplifier U1 receives a voltage drop Vf having occurred in the temperature sensor diode 6 and Vsen of the shunt resistor 7, amplifies a difference voltage between Vf and Vsen, and outputs the resultant voltage. Vf is inputted to a non-inversion input terminal of the first differential amplifier U1 as a positive voltage relative to the reference potential SG, Vsen is inputted to an inversion input terminal of the first differential amplifier U1 as a negative voltage relative to the reference potential SG, and a voltage proportional to the difference between these voltages is outputted. A Zener diode D3 connected to the output side of the first differential amplifier U1 is provided for performing offset adjustment on the output voltage from the first differential amplifier U1. The breakdown voltage of the Zener diode D3 has a temperature characteristic. The Zener diode D3 is configured to, by being disposed at a position under an environment with the same temperature as the temperature of heat dissipation fins to which the drive control circuit 2 or the switch element 1 is connected, adjust an offset voltage according to the magnitude of the temperature. A second differential amplifier U2 outputs, as a voltage V2_, a voltage difference between a voltage V1 generated by a constant voltage control element D7 which is, for example, a Zener diode and a voltage V1_ obtained through the offset adjustment performed, by the Zener diode D3, on the output voltage from the first differential amplifier U1. The constant voltage control element D7 is also configured to, by being disposed at a position under a temperature condition equivalent to a temperature condition for the Zener diode D3, control the magnitude of the voltage V1 according to the temperature. The output side of the second differential amplifier U2 is connected to a non-inversion input terminal of the third differential amplifier U3 with a resistor R2 interposed therebetween. The non-inversion input terminal of the third differential amplifier U3 is further connected to a gate signal terminal 3 with a diode D6 interposed therebetween. To the gate signal terminal 3, gate signals for turning on and off the switch element 1 are inputted. Out of the gate signals inputted to the gate signal terminal 3, an ON signal has a low level, and an OFF signal has a high level. Therefore, when an ON signal is inputted to the gate signal terminal 3, the diode D6 is turned on, whereby the potential Vset of the non-inversion input terminal of the third differential amplifier U3 comes to have the low level. Meanwhile, if an OFF signal is inputted to the gate signal terminal 3, the diode D6 is turned off, whereby the potential Vset becomes the potential of V2_.

Figure 3:
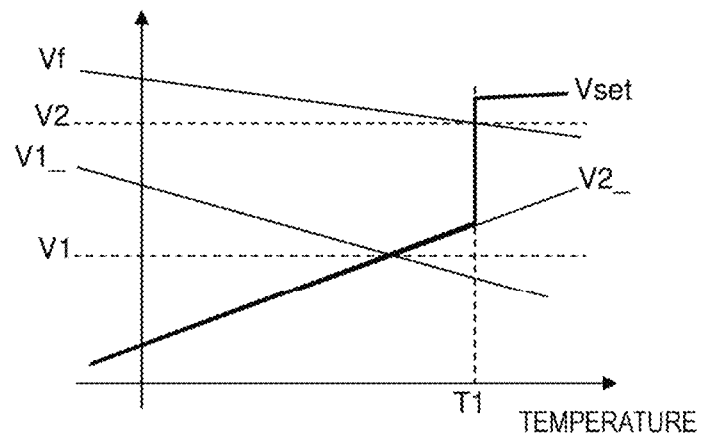
FIG. 3 is a graph for explaining an operation based on change in temperature, in the power semiconductor element gate driving circuit according to embodiment 1.

Hereinafter, an operation performed when the gate signal is changed to an OFF signal, i.e., in an OFF state where electric charges are discharged from the gate electrode of the switch element 1, will be described. Firstly, an operation, in an OFF state, of the power semiconductor element gate driving circuit shown in FIG. 2 upon change in the temperature will be described with reference to FIG. 3 showing voltages of the respective portions with respect to the temperature. In the following descriptions, the operation upon change in the temperature will be explained, and thus the descriptions will be given with the voltage drop Vsen in the shunt resistor 7 being excluded under a condition that: the collector current of the switch element 1 is fixed; and Vsen is fixed. The forward-direction voltage drop Vf of the temperature sensor diode 6 has a characteristic of decreasing in association with increase in the temperature of the element. The temperature sensor diode 6 is configured to allow current to flow thereto via a constant current diode D2. Vf is inputted to the non-inversion input terminal of the first differential amplifier U1 so as not to cause any error in current of the constant current diode D2. If an amplification factor in the first differential amplifier U1 is defined as A, and a voltage drop in the Zener diode D3 is defined as Vz, the potential V1_ of an inversion input terminal of the second differential amplifier U2 is represented by the following expression.

$$V1\_ = A \times Vf - Vz \quad (1)$$

The second differential amplifier U2 amplifies the difference between the reference voltage V1 and V1_, to obtain the output V2_ which is represented by the following expression.

$$V2\_ = V1 - V1\_ = V1 - (A \times Vf - Vz) \quad (2)$$

V2_ determined according to expression (2) increases in association with increase in the temperature as shown in FIG. 3. In actuality, the second differential amplifier U2 is formed as an amplifier configured to adjust an offset when amplifying the difference between V1 and V1_. FIG. 3 shows a case where offset adjustment is performed such that the output V2_ becomes equal to V1 when V1 and V1_ match. The offset is preferably adjusted so as to obtain an advantageous effect on the basis of characteristics of the switch element 1, the temperature sensor diode 6, or the like. The second differential amplifier U2 only has to have a function of being able to adjust the offset to the difference between V1 and V1_, and thus is not limited to a differential amplifier and may be implemented by a subtraction circuit capable of offset adjustment. In an OFF state, the third differential amplifier U3 adjusts a gate voltage of a transistor J1 such that a voltage drop in a sensing resistor R1 becomes equal to Vset. Therefore, gate current in an OFF state is controlled to increase in association with increase in the temperature and is adjusted to shorten an OFF period of the switch element 1. In addition, Vset is adjusted to increase according to an output from a comparator U4 if Vf becomes equal to or lower than V2 as a result of increase in the temperature. It is noted that a pull-up resistor R6 and a diode D5 are connected to the output side of the comparator U4 such that, when Vf is higher than V2, i.e., the temperature is lower than a temperature T1, an output from the comparator U4 does not influence the voltage Vset.

The third differential amplifier U3 adjusts a gate voltage of the transistor J1 such that Vset and a voltage drop based on gate current in the sensing resistor R1 become equal to each other. Consequently, the gate current in an OFF state increases in association with increase in the temperature.

Thus, control is performed such that: a temperature characteristic of the OFF period of the switch element 1 is canceled out; and the switching time does not significantly change even upon change in the temperature. When the temperature of the switch element 1 exceeds T1, control is performed such that, according to the output from the comparator U4, the gate current is forcedly increased and a switching time in an OFF state is further shortened, in order to reduce loss in the switch element 1. The purpose of this control is to perform protection in cases of occurrence of deficiency in a dead time, such as a case where load current suddenly changes at a temperature higher than T1. Specifically, this control is performed in order to eliminate a short circuit in a short period in the case of a sudden change in load current, by performing an operation with a shorter time constant than the time constant in control that is performed at a temperature lower than the temperature T1 and that involves changing the gate current in association with change in the temperature. In addition, this circuit makes it possible to reduce switching loss when the temperature becomes equal to or higher than T1. Thus, further increase in the temperature of the switch element 1 can also be inhibited. In addition, the output from the comparator U4 can also be outputted to outside as a temperature abnormality signal for protecting the switch element 1 from being heated.

Figure 4:
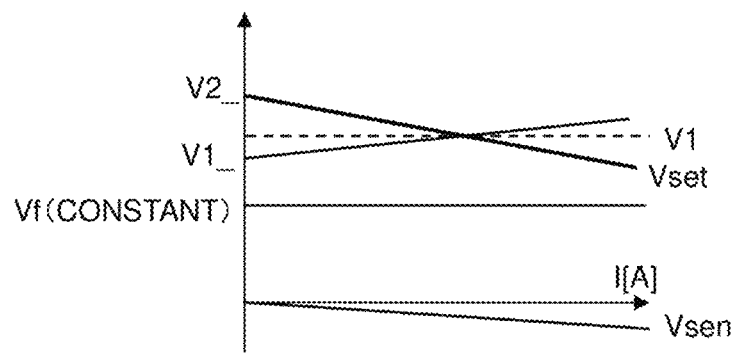
FIG. 4 is a graph for explaining an operation based on change in collector current of a power semiconductor element, in the power semiconductor element gate driving circuit according to embodiment 1.

Next, the feature of automatically controlling a change, in the switching time in an OFF state, based on a change in the collector current I of the switch element 1 will be described. FIG. 4 shows voltages of the respective portions with respect to collector current I. In order to facilitate understanding of descriptions, explanations will be given under a condition that the temperature of the switch element 1 does not change, i.e., a condition that Vf is fixed. The switch element 1 has a characteristic that the mirror voltage of the switch element 1 decreases when the collector current I at the time of switching decreases. Consequently, the potential difference between the mirror voltage in an OFF state and an output Vg for a gate electrode of the drive control circuit 2 in an OFF state decreases, and mirror current decreases. Thus, dVce/dt at the time of switching decreases. Therefore, if the gate voltage is controlled with a constant voltage in an OFF state, when the collector current I is small, the difference between a mirror potential Vm and the potential of a negative power supply decreases, and mirror current decreases. This leads to decrease in dVce/dt and elongation of the switching period. This phenomenon prominently occurs not only in the case in the present embodiment but also in the case of using no negative bias for the drive circuit or the case of using an element having a low threshold potential. In the present embodiment, in order not to elongate the switching period at a small collector current I, the shunt resistor 7 in FIG. 2 performs detection, based on the collector current I, as the detection voltage Vsen having a negative sign relative to the reference potential SG, a difference between Vsen and the voltage drop Vf in the temperature sensor diode 6 is obtained, and the first differential amplifier U1 amplifies the difference.

Change in the switching time upon change in the collector current I will be described with reference to FIG. 4. When the collector current I increases, the difference between Vf and Vsen increases in the first differential amplifier U1 so that the voltage V1_ increases. When V1_ increases, the output voltage V2_ from the second differential amplifier U2 which amplifies the difference between V1 and V1_ decreases. Consequently, control is performed such that: Vset decreases; and the gate current in an OFF state decreases. That is, in a state where the switch element 1 is OFF, control is performed such that the gate current (mirror current) is larger at the time of interrupting small collector current than at the time of interrupting large collector current. Thus, even if the collector current of the switch element 1 changes, a period that Vge takes to reach the mirror potential can be shortened. Consequently, control is performed so as to reduce, according to the magnitude of the collector current, a change in a period from a time at which the gate signal from the gate signal terminal 3 is changed to an OFF signal to a time at which the switch element 1 is turned off, i.e., to a time at which a mirror period ends.

As described above, control is performed such that the gate current for discharging the electric charges from the gate electrode of the switch element 1 when the gate signal is changed to an OFF signal increases in association with increase in the temperature of the switch element 1 and decreases in association with increase in the collector current. More specifically, the gate current is controlled on the basis of the difference between the temperature detection value of the switch element 1 and the current detection value of the collector current. In one example of realizing this control, the temperature detection value is inputted to the non-inversion input terminal of the first differential amplifier U1 as a positive voltage that decreases in association with increase in the temperature, the current detection value is inputted to the inversion input terminal of the first differential amplifier U1 as a negative voltage, the absolute value of which increases in association with increase in the current, and the gate current is controlled on the basis of the output from the first differential amplifier U1. In general, a power semiconductor element having a gate electrode is such that, under a switching condition that the temperature of the element is high and the collector current is small, the mirror potential at the time of switching becomes low, and a period from a time at which the gate signal is switched to an OFF signal to a time at which switching is ended is elongated. In the gate driving circuit according to the present embodiment 1, control is performed such that the gate current increases at high temperature and increases at small collector current. Consequently, a delay of the switching time in an OFF state particularly decreases. Therefore, an operation is performed such that change, in the switching time, based on change in the temperature and change in the collector current is little. As a result, a power semiconductor element gate driving circuit capable of shortening a dead time can be provided.

Although the circuits are formed as analog circuits such as the differential amplifiers in the present embodiment, the circuits are not limited to analog circuits and may be formed as digital circuits for controlling the gate current in an OFF state on the basis of the difference between the temperature detection value and the current detection value. In this case, a configuration may be employed in which: each detection value is detected as a voltage value relative to the reference potential; and the reference potential is adjusted according to an ambient temperature or the temperature of heat dissipation fins mounted with the switch element. Since the gate current in an OFF state is controlled on the basis of the difference between the temperature detection value and the current detection value regardless of whether an analog circuit or a digital circuit is used, the control circuit is not formed as a complicated one that switches a resistance. Thus, it is possible to provide, by means of a simple configuration, a power semiconductor element gate driving circuit in which: the switching time in an OFF state changes only a little; and the dead time can be shortened.

Embodiment 2

Figure 5:
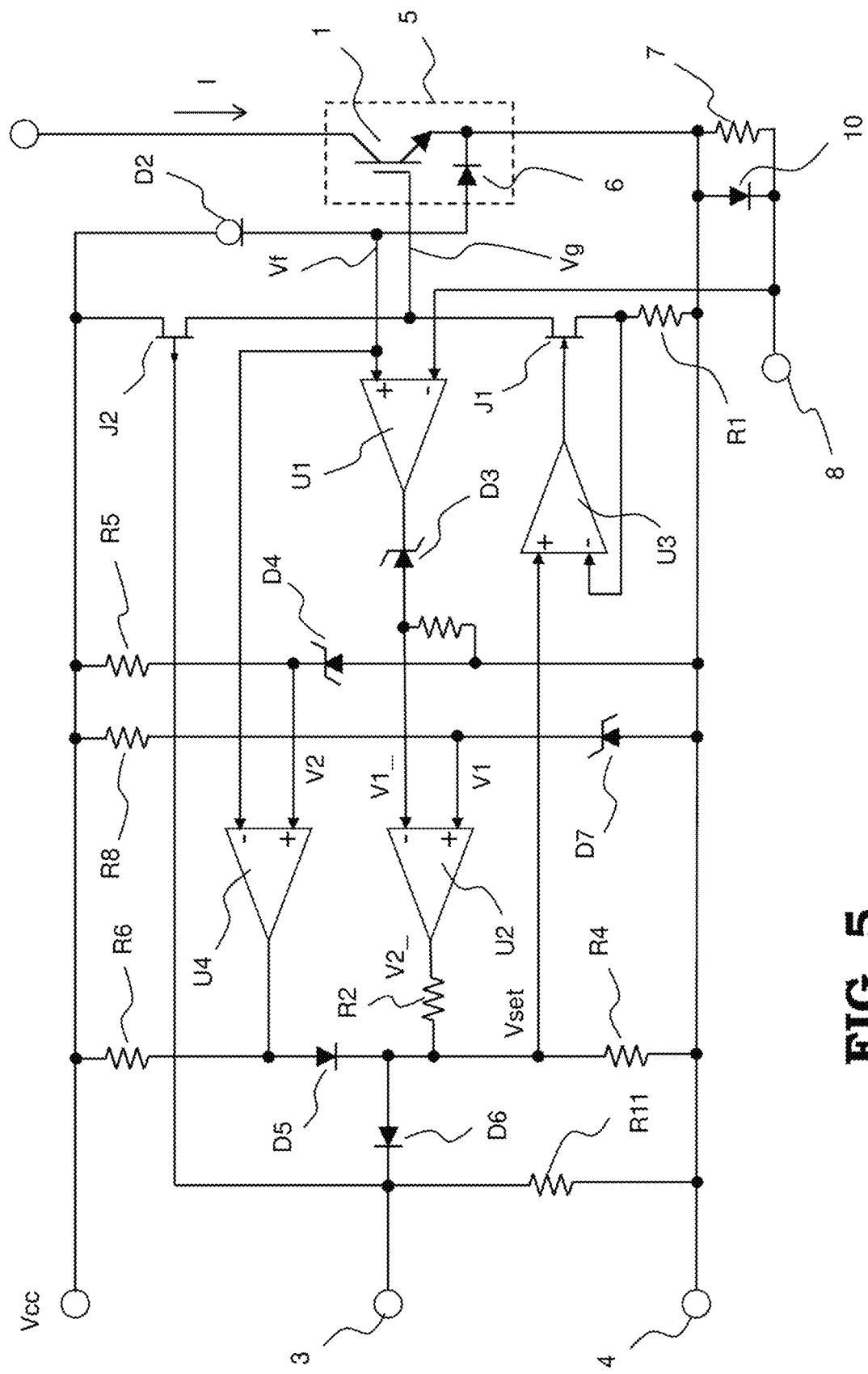
FIG. 5 is a circuit diagram showing a detailed configuration of a power semiconductor element gate driving circuit according to embodiment 2.

FIG. 5 is a circuit diagram showing a power semiconductor element gate driving circuit according to embodiment 2. A difference from embodiment 1 is that a diode 10 is connected in parallel to the shunt resistor 7. The other components are the same as those in embodiment 1. In embodiment 1, the gate current, in an OFF state, of the switch element 1 is controlled to decrease in association with increase in the collector current. In the case where the switch element 1 is an IGBT, Vth changes significantly upon a change within a region in which the collector current is small, but Vth changes less at a larger collector current. Further, within a region in which the collector current is large, a delay of the OFF period might increase more than necessary in association with increase in the temperature. In such a case, adverse influence might be inflicted with only the control described in embodiment 1. In order to suppress the adverse influence, current flowing through the shunt resistor 7 is limited. To this end, the diode 10 is connected in parallel to the shunt resistor 7 such that the magnitude of Vsen does not significantly change within the region in which the collector current I is large. Although a configuration in which the diode 10 is connected in parallel to the shunt resistor 7 is shown in FIG. 5 as a configuration for limiting Vsen, a Zener diode may be connected instead of the diode 10, with an anode and a cathode being inverted.

Figure 6:
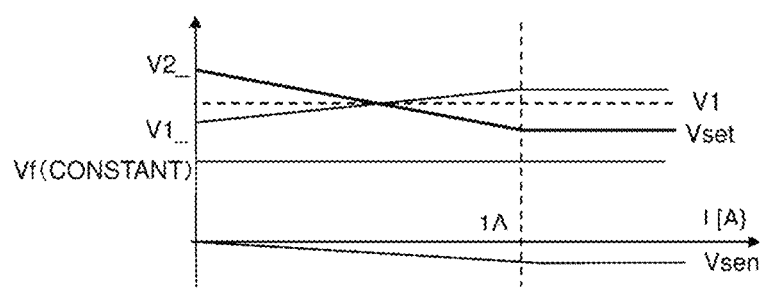
FIG. 6 is a graph for explaining an operation based on change in the collector current of the power semiconductor element, in the power semiconductor element gate driving circuit according to embodiment 2.

FIG. 6 shows changes in voltages of the respective portions with respect to collector current I. With reference to FIG. 6, description will be given by taking, as an example, a case where the switch element 1 has a characteristic that a voltage drop that occurs in a parallel unit composed of the shunt resistor 7 and the diode 10 hardly changes within a region in which the collector current I is equal to or larger than 1 A. The resistance value of the shunt resistor 7 and characteristics of the diode 10 are set such that the voltage value of the voltage drop having occurred at the shunt resistor 7 when a current of 1 A flows through the shunt resistor 7, becomes equal to a threshold voltage of the diode 10. By this setting, most of the collector current I flows through the shunt resistor 7 within a region in which the collector current is equal to or smaller than 1 A. Thus, the magnitude of Vsen increases to the negative side from the reference potential in proportion to current. As a result, adjustment is performed such that, in this current region, V1_ increases and V2_ decreases in association with increase in the current value. If V2_ decreases, the third differential amplifier U3 performs control such that the current flowing through the sensing resistor R1, i.e., the gate current in an OFF state, decreases. Within the current region in which the collector current I is equal to or larger than 1 A, the collector current I flows through the diode 10, and thus Vsen becomes equal to the threshold voltage of the diode 10 and hardly changes.

If the diode is provided in parallel to the shunt resistor 7 so as to limit the maximum value of Vsen in this manner, control can be performed such that the gate current in an OFF state decreases in association with increase in the collector current only when the collector current I is equal to or smaller than a predetermined value. Meanwhile, when the collector current is equal to or larger than the predetermined value, further decrease in the gate current can be prevented, and the delay of the OFF period can be prevented from increasing. Constants in the circuits in FIG. 5 only have to be adjusted according to characteristics of the switch element 1 and the temperature sensor diode 6 which are targets.

Embodiment 3

Figure 7:
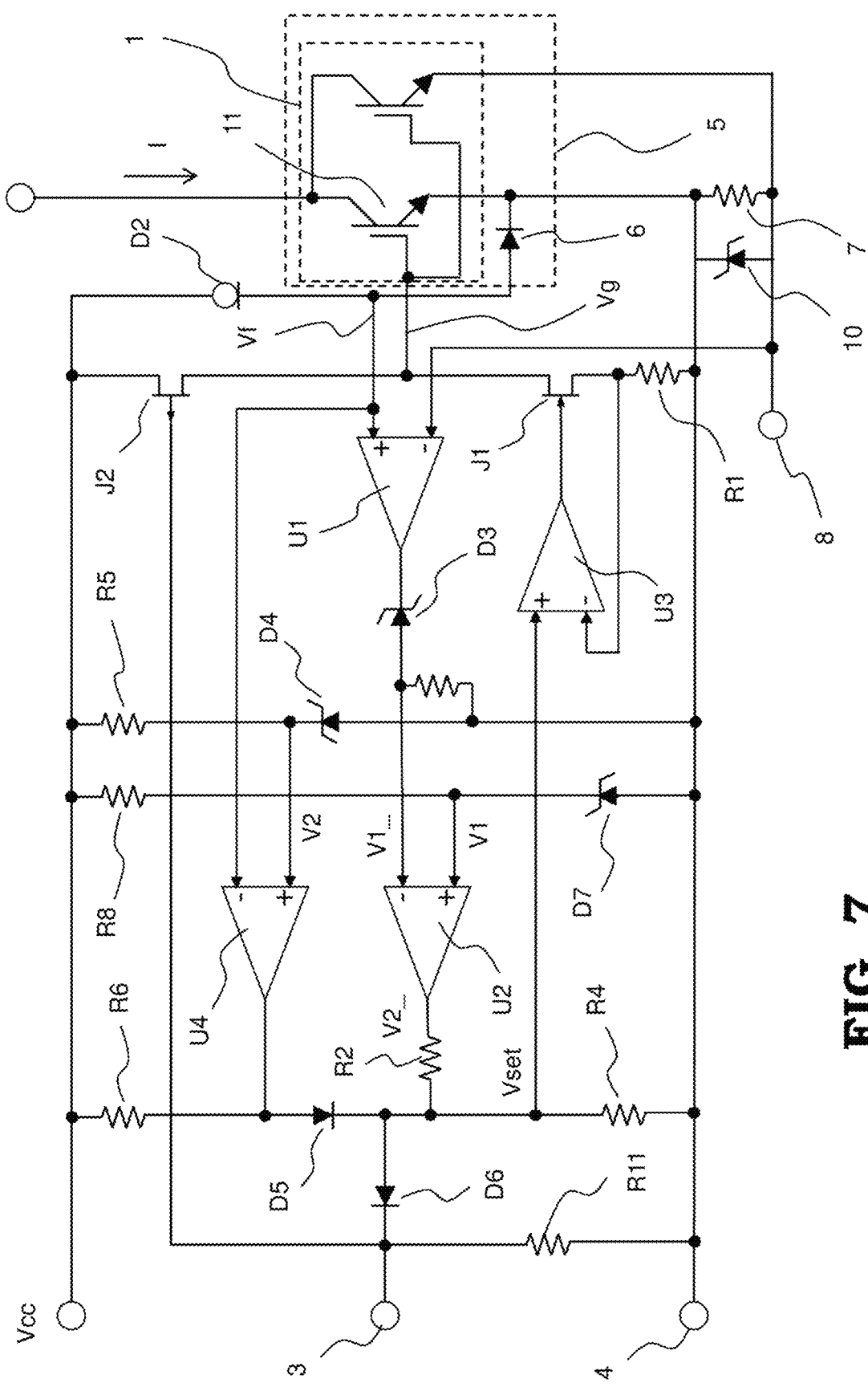
FIG. 7 is a circuit diagram showing a detailed configuration of a power semiconductor element gate driving circuit according to embodiment 3.

FIG. 7 is a circuit diagram showing a power semiconductor element gate driving circuit according to embodiment 3. In embodiment 1 and embodiment 2, description has been given regarding a configuration in which the total collector current I of the switch element 1 is set to flow through the shunt resistor 7 or the diode so that the collector current is detected. In this case, losses in the shunt resistor 7 and the diode 10 increase when large collector current flows. In embodiment 3, a power semiconductor element provided with a sensing cell 11 is used as the switch element 1 as shown in FIG. 7. In the present embodiment 3, current flowing through the sensing cell 11 is detected by the shunt resistor 7. Consequently, loss in the shunt resistor 7 caused by the current of the switch element 1 can be reduced. A cathode of the temperature sensor diode 6 is connected to an emitter of the sensing cell 11 so that influence of Vsen is not inflicted on Vf. Current division among chips for the switch element 1 is adjusted according to a gate resistance provided in the switch element 1. With this configuration, the current flowing through the switch element 1 flows in proportion to the cell effective areas of the entire switch element 1 and the sensing cell 11. Thus, the total collector current flowing through the switch element 1 can be ascertained from: the current flowing through the shunt resistor 7; and the proportion of the cell effective area of the sensing cell 11 to the cell effective area of the entire switch element 1. Alternatively, a current division ratio of the sensing cell 11 may also be ascertained through a test. Therefore, detection of a collector current of the sensing cell 11 makes it possible to adjust the gate current according to the value of the collector current as described in embodiments 1 and 2, without measuring the total current of the switch element 1. A configuration in which the Zener diode 10 is connected in parallel to the shunt resistor 7 is employed in FIG. 7, and this configuration can limit an upper limit value of Vsen in the same manner as that described in embodiment 2. With the above configuration, a collector current value can be detected without passage, through the shunt resistor 7, of the total collector current I flowing through the switch element 1. Thus, the switching time can be controlled by detecting the magnitude of the collector current I with only a small loss.

Although various exemplary embodiments and examples are described in the present application, various features, aspects, and functions described in one or more embodiments are not inherent in a particular embodiment, and can be applicable alone or in their various combinations to each embodiment. Accordingly, countless variations that are not illustrated are envisaged within the scope of the art disclosed herein. For example, the case where at least one component is modified, added or omitted, and the case where at least one component is extracted and combined with a component in another embodiment are included.

DESCRIPTION OF THE REFERENCE CHARACTERS 1 power semiconductor element
2 drive control circuit
3 gate signal terminal
4 reference potential terminal
6 diode (temperature sensor diode)
7 shunt resistor
10 diode
U1 first differential amplifier
U2 second differential amplifier

The invention claimed is:

1. A power semiconductor element gate driving circuit that performs ON/OFF control on main current of a power semiconductor element having a gate electrode by charging the gate electrode of the power semiconductor element with electric charges and discharging the electric charges on the basis of an inputted gate signal, and comprising:
   a first differential amplifier that outputs a difference between a temperature detection value obtained by detecting the temperature of the power semiconductor element and a current detection value which is a detection value of the main current, and
   a second differential amplifier that controls a gate current for discharging the electric charges from the gate electrode on the basis of an output from the first differential amplifier,
   wherein
   when the gate signal is switched to an OFF signal, control is performed such that the gate current increases in association with increase in a temperature of the power semiconductor element and decreases in association with increase in the main current.

2. The power semiconductor element gate driving circuit according to claim 1, wherein
   the temperature detection value and the current detection value are each a value detected as a voltage relative to a reference potential,
   the temperature detection value is a positive voltage that decreases in association with increase in the temperature, and
   the current detection value is a negative voltage, an absolute value of which increases in association with increase in the main current.

3. The power semiconductor element gate driving circuit according to claim 2, wherein
   the temperature detection value is inputted to a non-inversion input terminal of the first differential amplifier and
   the current detection value is inputted to an inversion input terminal of the first differential amplifier; and
   an output from the first differential amplifier is inputted to an inversion input terminal of the second differential amplifier.

4. The power semiconductor element gate driving circuit according to claim 3, wherein
   the temperature detection value is a voltage value across a diode serving as a temperature sensor, and
   the current detection value is a voltage value across a shunt resistor which detects the main current.

5. The power semiconductor element gate driving circuit according to claim 4, further comprising
   a diode connected in parallel to the shunt resistor.

6. The power semiconductor element gate driving circuit according to claim 5, wherein
   the diode connected in parallel to the shunt resistor is a Zener diode.

7. The power semiconductor element gate driving circuit according to claim 6, wherein
   the power semiconductor element includes a sensing cell, and
   the shunt resistor is connected to the sensing cell.

8. The power semiconductor element gate driving circuit according to claim 5, wherein
   the power semiconductor element includes a sensing cell, and
   the shunt resistor is connected to the sensing cell.

9. The power semiconductor element gate driving circuit according to claim 2, wherein
   the temperature detection value is a voltage value across a diode serving as a temperature sensor, and the current detection value is a voltage value across a shunt resistor which detects the main current.

10. The power semiconductor element gate driving circuit according to claim 9, further comprising
a diode connected in parallel to the shunt resistor.

11. The power semiconductor element gate driving circuit according to claim 10, wherein
the diode connected in parallel to the shunt resistor is a Zener diode.

12. The power semiconductor element gate driving circuit according to claim 11, wherein
the power semiconductor element includes a sensing cell, and
the shunt resistor is connected to the sensing cell.

13. The power semiconductor element gate driving circuit according to claim 10, wherein
the power semiconductor element includes a sensing cell, and
the shunt resistor is connected to the sensing cell.

14. The power semiconductor element gate driving circuit according to claim 9, wherein
the power semiconductor element includes a sensing cell, and
the shunt resistor is connected to the sensing cell.

15. The power semiconductor element gate driving circuit according to claim 1, wherein
when the gate signal is switched to the OFF signal, and the temperature of the power semiconductor element is equal to or higher than a predetermined temperature, the gate current for discharging the electric charges from the gate electrode is forcedly controlled to have a predetermined value.

* * * * *